United States Patent
Mar et al.

(10) Patent No.: US 11,018,680 B1
(45) Date of Patent: May 25, 2021

(54) PHASE LOCK LOOPS (PLLS) AND METHODS OF INITIALIZING PLLS

(71) Applicant: Keysight Technologies, Inc., Santa Rosa, CA (US)

(72) Inventors: Wing Mar, Rohnert Park, CA (US); Reto Zingg, Santa Rosa, CA (US)

(73) Assignee: Keysight Technologies, Inc., Santa Rosa, CA (US)

( * ) Notice: Subject to any disclaimer, the term of this patent is extended or adjusted under 35 U.S.C. 154(b) by 0 days.

(21) Appl. No.: 16/929,593

(22) Filed: Jul. 15, 2020

(51) Int. Cl.
| | |
|---|---|
| *H03L 7/10* | (2006.01) |
| *H03L 7/197* | (2006.01) |
| *H03L 7/099* | (2006.01) |
| *H03L 7/093* | (2006.01) |

(52) U.S. Cl.
CPC ............ *H03L 7/10* (2013.01); *H03L 7/093* (2013.01); *H03L 7/099* (2013.01); *H03L 7/1974* (2013.01)

(58) Field of Classification Search
CPC combination set(s) only.
See application file for complete search history.

(56) References Cited

U.S. PATENT DOCUMENTS

| | | | |
|---|---|---|---|
| 5,132,642 A | 7/1992 | Bush et al. | |
| 6,066,988 A * | 5/2000 | Igura | H03K 3/03 327/142 |
| 7,205,848 B2 | 4/2007 | Cordos et al. | |
| 7,417,477 B2 | 8/2008 | Koyama et al. | |
| 7,804,367 B2 * | 9/2010 | Lee | H03L 7/1976 331/16 |
| 7,956,696 B2 * | 6/2011 | Hoang | H03L 7/18 331/25 |
| 8,953,730 B2 | 2/2015 | Chen et al. | |
| 9,628,094 B2 | 4/2017 | Lotfy et al. | |
| 2006/0160492 A1 * | 7/2006 | Jensen | H03L 7/093 455/76 |
| 2007/0069781 A1 * | 3/2007 | Kim | H03L 7/087 327/158 |
| 2007/0075787 A1 * | 4/2007 | Jensen | H03L 7/093 331/17 |

(Continued)

FOREIGN PATENT DOCUMENTS

WO    9913582 A1    3/1999

OTHER PUBLICATIONS

Wei-Bin Yang et al., "A fast-locking all-digital PLL with dynamic loop gain control and phase self-alignment mechanism for sub-GHz IoT applications," Japanese Journal of Applied Physics 59, SGGL08 (2020), pP. 1-12.

*Primary Examiner* — Adam D Houston (57) ABSTRACT

A phase lock loop (PLL) includes a phase detector configured to output a signal indicative of a phase difference between a reference signal and a feedback signal, a loop filter configured to filter an output of the phase detector, and a voltage-controlled oscillator (VCO) configured to output an oscillating signal having a frequency corresponding to an output of the loop filter. The PLL further includes a frequency divider configured to output the feedback signal by frequency dividing the oscillating signal output by the VCO, and a reset circuit configured to reset the frequency divider in an initialization mode such that a phase difference between the reference signal and the feedback signal corresponds to a lock angle of the PLL.

16 Claims, 9 Drawing Sheets

(56) References Cited

U.S. PATENT DOCUMENTS

| | | | | |
|---|---|---|---|---|
| 2008/0048791 | A1* | 2/2008 | Fahim | H03L 7/085 |
| | | | | 331/1 A |
| 2008/0136535 | A1* | 6/2008 | Khorram | H03L 7/0895 |
| | | | | 331/17 |
| 2009/0054075 | A1* | 2/2009 | Boejer | G01S 19/09 |
| | | | | 455/456.1 |
| 2011/0090998 | A1* | 4/2011 | Zhang | H03L 7/1976 |
| | | | | 375/365 |
| 2012/0119839 | A1* | 5/2012 | Takahashi | H03L 7/099 |
| | | | | 331/36 C |
| 2012/0319748 | A1* | 12/2012 | Luo | H03L 7/085 |
| | | | | 327/158 |
| 2013/0002317 | A1* | 1/2013 | Frantzeskakis | H03L 7/08 |
| | | | | 327/156 |
| 2017/0187384 | A1* | 6/2017 | Shimada | H03L 1/027 |

* cited by examiner

PHASE LOCK LOOPS (PLLS) AND METHODS OF INITIALIZING PLLS

BACKGROUND

Phase lock loops (PLLs) can be used, for example, to generate stable output high frequency signals from a fixed low-frequency signal. Generally, a PLL is composed of a voltage-controlled oscillator (VCO) and a feedback path that maintains a constant phase angle of the VCO output relative to a reference signal.

Figure 1:
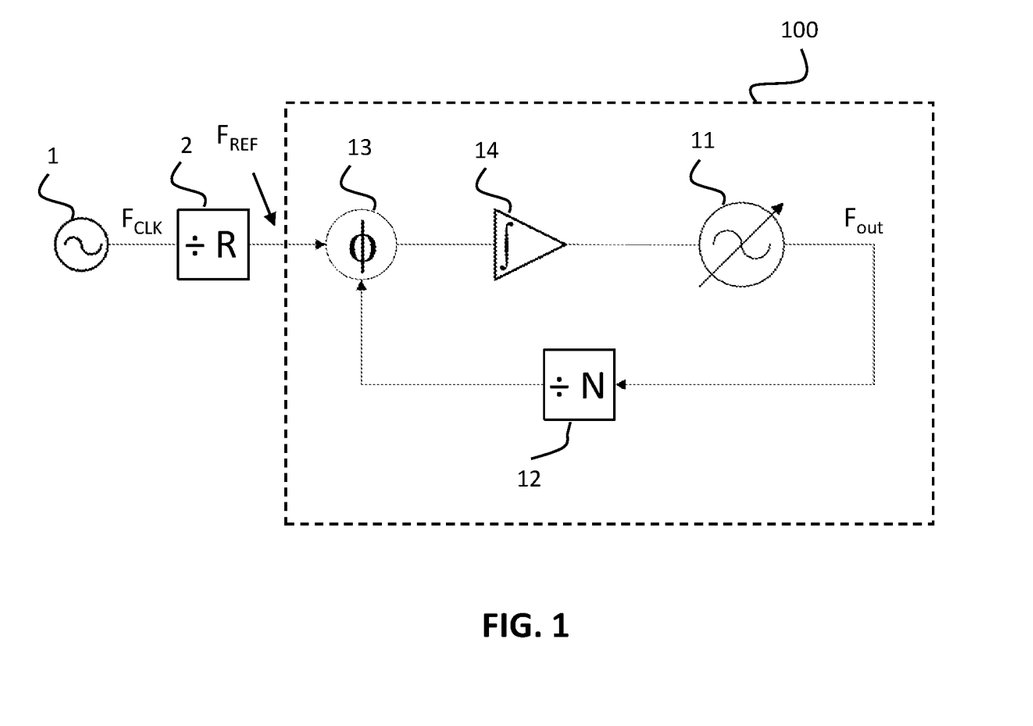
FIG. 1 is circuit diagram of a phase lock loop (PLL) of the related art.

FIG. 1 is a circuit diagram of a PLL 100 of the related art. As shown, the PLL of this example includes a VCO 11, a frequency divider 12, a phase detector 13 and a loop filter 14. The frequency divider 12 is in a feedback path of the PLL 100 between an output of the VCO 11 and the phase detector 13.

In operation, the VCO 11 outputs a VCO output signal having a frequency $F_{OUT}$. A portion of the VCO output signal is diverted to the frequency divider 12. The frequency divider 12 divides the frequency $F_{OUT}$ of the VCO output signal by a PLL feedback divider ratio N. The divider ratio N may be fixed or programmable. The output of the frequency divider 12 has a frequency $F_{OUT}/N$ and is provided as a feedback signal to the phase detector 13.

A reference signal is also provided to the phase detector 13. As in the example of FIG. 1, the reference signal may be obtained, for example, by dividing the clock frequency $F_{CLK}$ of an output signal of a reference oscillator 1 by a fixed or programmable reference divider ratio R using a frequency divider 2. The reference oscillator 1 may, as examples, be a crystal oscillator (XO) or a temperature compensated crystal oscillator (TCXO). As a result, the reference signal applied to the phase detector 13 has a reference frequency $F_{REF}=F_{CLK}/R$. The phase detector 13 compares the feedback signal from the frequency divider 12 to the reference signal and outputs a phase detection output signal representing a phase difference between feedback signal and reference signal. The loop filter 14 filters the phase detection output signal to produce a control signal or tuning voltage which is applied to VCO 11 (e.g., to one or more varactors of the VCO 11) to tune the output frequency $F_{OUT}$ of the VCO output signal. As is well known, in a steady state the output frequency $F_{OUT}$ is equal to the product of the clock frequency $F_{CLK}$ and the ratio N/R (i.e., $F_{OUT}=F_{CLK}*N/R$).

As described above, a PLL is generally configured with a VCO and a loop divider that produces a feedback signal of a divided VCO phase. A phase detector compares the divided VCO phase to a reference to produce an error signal. The error signal drives a loop filter to produce a tuning voltage which controls a frequency, and thus a phase, of the VCO. In a steady state, a given phase difference between the divided VCO phase and the reference phase is realized, and the PLL is deemed "locked" when the divided VCO phase tracks the reference phase. Generally, the PLL loop will usually drive the output of the phase detector 13 (i.e. the input to loop filter 14) towards zero. The actual phase relation between the two signals applied to the phase detector 13 depends on the type of phase detector 13. For a mixer, the two signals will be in quadrature (i.e. 90 degrees out of phase) in order to minimize the output voltage. For other types of phase detectors the two signals may be in phase, or 180 degrees out of phase. In any case, the difference in phase between the two signals in the steady state is referred to herein as a lock angle.

For a PLL with a VCO having a high-Q resonator, the loop bandwidth is necessarily narrow to preserve as much of the VCO phase-noise as possible. In this case, the typical loop bandwidth may be much less than 1 Hz, which disadvantageously requires a long lock time. Another source of an extended locking time is the time required to rotate the phase at the detector frequency due to a high N ratio, low detector frequency and limited VCO tuning range available to the PLL (loop filter).

SUMMARY

According to an aspect of the inventive concepts, a phase lock loop (PLL) is provided that includes a phase detector configured to output a signal indicative of a phase difference between a reference signal and a feedback signal, a loop filter configured to filter an output of the phase detector, and a voltage-controlled oscillator (VCO) configured to output an oscillating signal having a frequency corresponding to an output of the loop filter. The PLL further includes a frequency divider configured to output the feedback signal by frequency dividing the oscillating signal output by the VCO, and a reset circuit configured to reset the frequency divider in an initialization mode such that a phase difference between the reference signal and the feedback signal corresponds to a lock angle of the PLL.

The reset circuit may be a delay circuit configured to delay the reference signal by the lock angle of the PLL and to apply the delayed reference signal as a reset signal to the frequency divider. The delay circuit may be programmable.

The reset circuit may be a counter activated in response to the reference signal. A terminal count of the counter may be programmable to correspond in duration to the lock angle of the PLL. The counter may be configured to reset the frequency divider when a count value reaches the terminal count. The reference signal may be a fractional-R divided clock signal, and the reset circuit may be activated in response to a cycle of the reference signal having a phase in a vicinity of an average phase of the reference signal.

The PLL may further include a frequency multiplier configured to multiply a frequency of the oscillating signal output by the VCO and to apply a resultant multiplied frequency signal as an input to the frequency divider.

The frequency divider may be a fractional-N frequency divider.

According to another aspect of the inventive concepts, a method of initializing a phase lock loop (PLL) is provided. The PLL includes a frequency divider in a feedback loop between an output of a voltage-controlled oscillator (VCO) and an input to a phase detector, the phase detector comparing a phase between a reference signal and an output of the frequency divider to drive the VCO. The method includes programming a terminal count of a programmable counter such that a count duration to the terminal count corresponds to a duration of a lock angle of the PLL at a reference frequency of the reference signal, activating the counter upon detecting a given phase angle of the reference signal, and presetting the frequency divider when a count value of the counter reaches the terminal count.

The given phase angle of the reference signal may be a positive edge or negative edge of the reference signal.

The method may further include closing the feedback loop upon presetting the phase angle of the frequency divider.

The frequency divider of the PLL may be a fractional-N frequency divider.

The reference signal may be a fractional-R divided clock signal, and the frequency divider of the PLL may be preset in response to a cycle of the reference signal having a phase in a vicinity of an average phase of the reference signal.

According to still another aspect of the inventive concepts, a method of initializing a phase lock loop (PLL) is provided. The PLL includes a frequency divider in a feedback loop between an output of a voltage-controlled oscillator (VCO) and an input to a phase detector, the phase detector comparing a phase between a reference signal and an output of frequency divider to drive the VCO, where the reference signal is a fractional-R divided clock signal. The method includes activating a counter upon detecting a positive edge or negative edge of the reference signal in a cycle of the reference signal having a phase in a vicinity of an average phase of the reference signal. The method further includes presetting, in response to the counter reaching a terminal count, the frequency divider of the PLL such that a difference between the phase angle of the reference signal and a phase angle of the frequency divider output corresponds to a lock angle of the PLL.

The method may further include closing the feedback loop upon presetting the phase angle of the frequency divider.

BRIEF DESCRIPTION OF THE DRAWINGS

The above and other aspects and features of the inventive concepts will become readily apparent from the detailed description that follows, with reference to the accompanying drawings, in which.

DETAILED DESCRIPTION OF EMBODIMENTS

As described above in the background section, in a phase lock loop (PLL) including a high-Q oscillator such as an OCXO (oven-controlled crystal oscillator), the loop bandwidth optimized for phase noise is necessarily narrow to preserve as much of the low phase noise characteristic of the OCXO as possible. The typical loop bandwidth may be much less than 1 Hz, which requires a long lock time. A common way to speed-up the locking process is to temporarily increase the loop bandwidth for locking. Even though the loop bandwidth can be increased by about an order of magnitude, limited by the tuning bandwidth of OCXO and the pole and zero locations of the PLL, the lock time is still significant when the loop bandwidth is, for example, increased from 0.015 Hz to 0.15 Hz. Furthermore, the time to achieve the correct phase at the phase detector is inversely proportional to the maximum achievable frequency difference at the phase detector. In situations with a small fractional tuning range and low detector frequency, wait times can be as long as tens of seconds.

The speed at which the divided VCO tracks the reference is dependent on where the magnitude of the open-loop gain of the PLL equals to unity, which is commonly known as the loop bandwidth. Most PLL designs have reasonably wide loop bandwidths. When the VCO is a high-Q oscillator with narrow tuning range, the loop bandwidth must necessarily be narrow as well. One problem with narrow loop bandwidth PLLs is the long amount of time required to achieve lock.

For example, a 10-MHz OCXO with 1.4 ppm (14 Hz) of tuning range, the optimal loop bandwidth may only be 10 to 15 mHz due to the low phase noise of the high-Q oscillator. Modelling the PLL as a single-pole low-pass response with 15 mHz of corner frequency, the time constant of $1/(2\pi(15 \text{ mHz}))$ would be 10.6 seconds. For the phase error to be less than 1%, it would take about 5 time-constants or around 53 seconds.

The phase detector cannot distinguish frequency difference. The initial frequency difference must be less than the loop bandwidth for the loop to lock. Frequency acquisition can take a long time prior to phase locking. One way to speed-up frequency acquisition is by accurately pre-tuning the VCO to the exact frequency prior to closing the loop. The tuning digital-to-analog converter (DAC) can tune the VCO over its full range and the PLL is typically designed to tune over a much smaller range. That limited tuning range accessible to the PLL leads to a further prolongation of the locking process. Phase difference at the phase detector is the integral of the frequency difference over time. With the frequency difference being limited, the loop has to wait a longer time to achieve the necessary phase correction.

In addition to pre-tuning the VCO, the usual way of speeding up the locking process is to temporarily boost the loop bandwidth. In practice, without adding a lot of hardware, the gain boost is limited to a factor of 10 or 100 or so. For a very narrow initial loop bandwidth, this widening of loop bandwidth may still not be fast enough due to the lengthy amount of time required to monitor for lock. Occasionally the PLL may overshoot and fail to achieve lock on the first try and we typically must tolerate extra amount of monitor time to ensure successful locking.

The variation in locking time is due to the randomness of the initial relative phase at the phase detector when the loop is closed. If the initial phase is close to the lock angle, the loop would lock quickly. The farther away from the lock angle, the longer it would take for the loop to achieve lock and the higher the probability of losing lock. This problem is exacerbated at low reference frequency where the loop divider N is large, because the VCO tuning range available to the PLL is divided by N as well.

For the high-Q OCXO of the previous example with 1.4 ppm of tuning range locking to a 500 kHz reference, the effective N is 10 MHz/500 kHz=20. The total tuning range at the phase detector is 0.7 Hz, but only a given percentage may be available to the PLL due to pretuning, so the maximum achievable tuning range may be less than 0.7 Hz. If the initial phase difference is such that the PLL must slew the phase by a full cycle to achieve lock, then, even with infinite PLL bandwidth, it would take from one end of the tuning range to the other end to achieve lock. For example, if the maximum achievable tuning range is 0.07 Hz, locking would take more than 1/0.07 Hz=14.2 seconds. If the reference were 10 MHz instead of 500 kHz, the time would be reduced to 0.72 seconds.

Embodiments of the inventive concepts are directed to techniques for accelerating locking times by presetting the relative angle between the PLL feedback signal and the reference signal to the lock angle of the PLL. In the absence of these techniques, the PLL may first have to slew the voltage-controlled oscillator (VCO) tune voltage to its limit, then wait for enough phase to accumulate, then slew the tune voltage back to end up at the correct frequency and phase. On the other hand, by applying these techniques, the PLL does not need to slew the tune voltage as far, nor does it have to wait to accumulate sufficient phase to steer the OCXO to the lock point.

Figure 2:
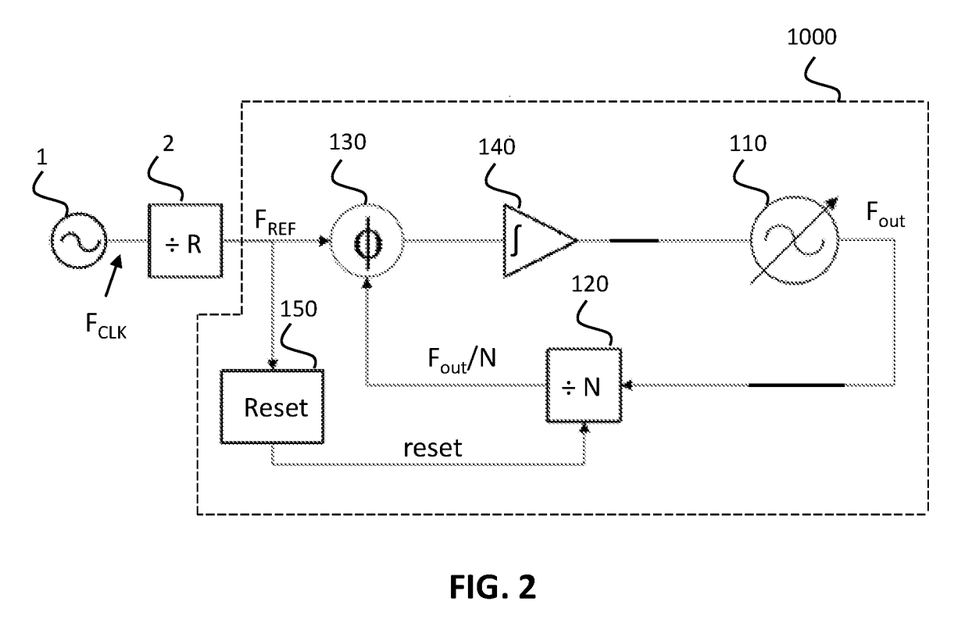
FIG. 2 is a circuit diagram of a phase lock loop (PLL) of an embodiment of the inventive concepts.

FIG. 2 is a circuit diagram of a PLL 1000 according to an embodiment of the inventive concepts.

Referring to FIG. 2, the PLL 1000 of the example of this embodiment includes a VCO 110, a frequency divider 120, a phase detector 130, a loop filter 140 and a reset circuit 150. The frequency divider 120 is in a feedback path of the PLL 1000 between an output of the VCO 110 and the phase detector 130.

The reset circuit 150 is operative in an initialization mode of the PLL 1000 to reset the frequency divider 120 (for example as described later in connection with the embodiments of FIGS. 4, 6 and/or 8). For example, the reset circuit 150 may delay a positive edge (or negative edge) of the reference signal by a delay time corresponding to a lock angle of the PLL at a given detector frequency. The thus delayed positive edge (or negative edge) of the reference signal may be applied to reset the frequency divider 120, and the PLL feedback loop is then closed. In this way, the relative phase angle between the PLL feedback signal and the reference signal is preset to the lock angle of the PLL. As an aside, it is noted that setting the phase is discretized by N. That is, for example, with N=10, there are ten possible phase settings to pick from (in 360 degrees), hence a step size of 36 degrees. The higher the N, the finer the adjustability, i.e., N=2 leads to 180 degrees, N=4 to 90 degrees, and so on. In any event, as another example, the reset circuit 150 may start a counter upon detecting the positive edge (or negative edge) of the reference signal, and a terminal count of the counter may be programmed to correspond in duration to the duration of the lock angle of the reference signal. The frequency divider 120 may then be reset upon the count value of the counter reaching the terminal count.

It is noted that the frequency divider 2 (i.e., the R-divider) may be omitted, in which case the reference signal to the phase detector 130 and the reset circuit 150 may be sinusoidal. Here, it will be understood that the positive and negative "edges" mentioned previously may be positive or negative zero crossing points of a sinusoidal reference signal.

After initialization, the PLL 1000 operates as described previously in connection with FIG. 1. Namely, the VCO 110 outputs a VCO output signal having a frequency $F_{OUT}$. A portion of the VCO output signal is diverted to the frequency divider 120 that was reset during the initialization mode. The frequency divider 120 divides the frequency $F_{OUT}$ of the VCO output signal by a PLL feedback divider ratio N. The divider ratio N may be fixed or programmable. The output of the frequency divider 120 has a frequency $F_{OUT}/N$ and is provided as a feedback signal to the phase detector 130.

A reference signal is also provided to the phase detector 130. Still referring to FIG. 2, the reference signal may be obtained, for example, by dividing the clock frequency $F_{CLK}$ of an output signal of a reference oscillator 1 by a fixed or programmable reference divider ratio R using a frequency divider 2. The reference oscillator 1 may, as examples, be a crystal oscillator (XO) or a temperature compensated crystal oscillator (TCXO). As a result, the reference signal applied to the phase detector 130 has a reference frequency $F_{REF}=F_{CLK}/R$. The phase detector 130 compares the feedback signal from the frequency divider 120 to the reference signal and outputs a phase detection output signal representing a phase difference between feedback signal and reference signal. The loop filter 140 filters the phase detection output signal to produce a control signal or tuning voltage which is applied to VCO 110 (e.g., to one or more varactors of the VCO 110) to tune the output frequency $F_{OUT}$ of the VCO output signal. In a steady state the output frequency $F_{OUT}$ is equal to the product of the clock frequency $F_{CLK}$ and the ratio N/R (i.e., $F_{OUT}=F_{CLK}*N/R$).

The embodiments herein are not limited by the circuit particularities of the loop filter 140, and indeed, it may be possible to omit the loop filter 140. Generally, however, one function of the loop filter 140 is to remove unwanted components of phase detection frequencies from the output of the phase detector 130. Those skilled in the art will understand that multiple implementations of the loop filter 140 may be adopted.

Figure 3:
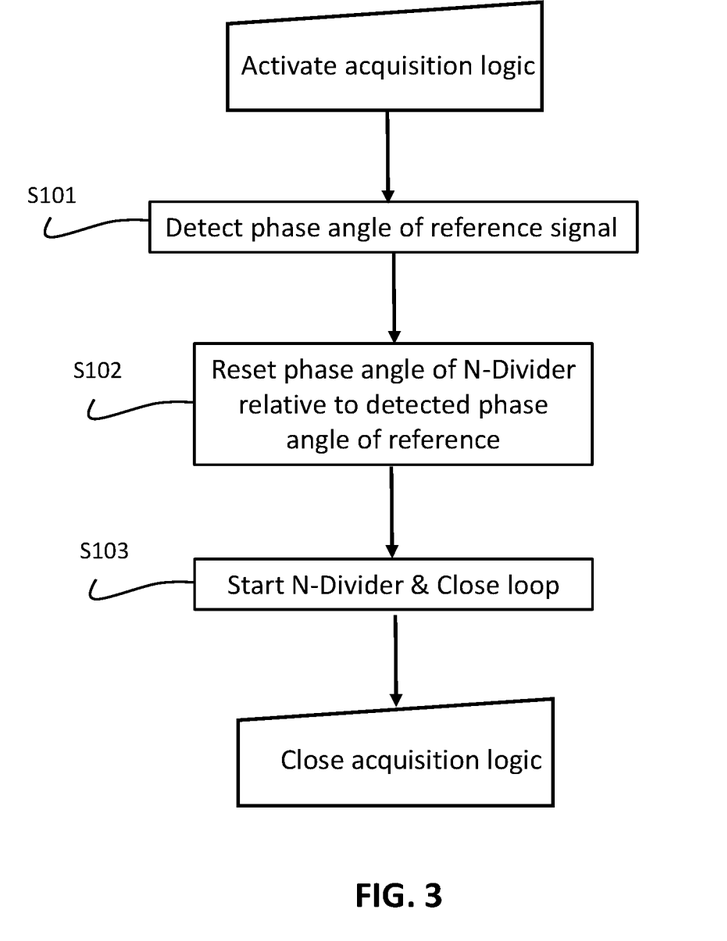
FIG. 3 is a flow diagram for reference in describing a method of operating a PLL according to an embodiment of the inventive concepts.

FIG. 3 is a flow diagram for reference in describing acquisition logic for initializing a PLL according to an embodiment of the inventive concepts.

Referring to FIGS. 2 and 3, prior to closing the PLL loop (i.e., prior to operating the PLL feedback path to synthesize an output frequency of the VCO 110), a phase angle of the reference signal at a given point in time is detected (S101). This may be achieved, for example, by detecting a positive edge (or negative edge) of the reference signal.

Then, the relative phase angle of the output of the frequency divider 120 in the PLL feedback path is set such that it differs from the phase angle of the reference signal by an amount corresponding in duration to the lock angle of the PLL (S102) at the reference frequency $F_{REF}$. This may be achieved, for example, by resetting the frequency divider 120 in the PLL feedback path at a given time after detecting the phase angle of the reference signal. In later embodiments, a programmable delay circuit or a programmable counter is used for this purpose. In some embodiments, the frequency divider 120 includes a counter which is reset to zero to establish the phase of the frequency divided signal applied to the phase detector of the PLL. The frequency divider 120 is started and the PLL loop is closed upon presetting of the frequency divider 120 (S103).

It is noted that the functionality of the reset circuit 150 may be implemented in the frequency divider 120. For example, in an alternative embodiment, the frequency divider 120 (i.e., N-divider) is configured to load a programmed value when an edge of the reference signal is detected. The load value is calculated such that the output of the frequency divider 120 is in the desired phase-relation to the reference signal. For example, in the case where the lock angle is 90 degrees and N=100, the divider 120 may be loaded with a value of 25 (or possibly 75 depending on phase polarity) just before closing the loop. In this case, the counter of the frequency divider 120 starts counting at 25 (or 75), rather than zero.

Separately, in an example, the loop may be "closed" by releasing the output of an integrator in the loop filter 140 from being held at 0V. In this way, the integrator may start out with a 0V output just after presetting the frequency divider 120.

As an example, in the case where the phase detector 130 is a mixer phase detector the lock angle of the PLL may be 90 degrees. In such a case, the frequency divider 120 is reset such that the relative phase angle between the reference signal and the output of the frequency divider 120 is 90 degrees. By presetting the phase angle of the PLL feedback signal relative to the reference signal the locking time is accelerated.

Figure 4:
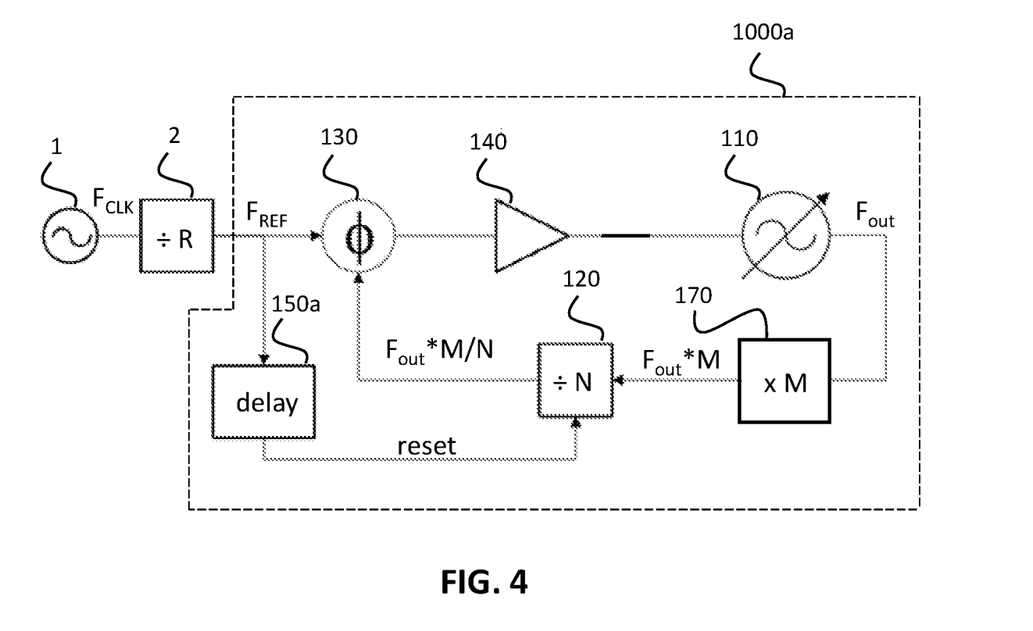
FIG. 4 is a circuit diagram of a phase lock loop (PLL) of another embodiment of the inventive concepts.

FIG. 4 is a circuit diagram of a PLL 1000a according to another embodiment of the inventive concepts.

Referring to FIG. 4, the PLL of the example of this embodiment includes a VCO 110, a frequency divider 120, a phase detector 130, a loop filter 140, a frequency multiplier 170 and a delay circuit 150a. The frequency multiplier 170 and the frequency divider 120 are in a feedback path of the PLL 1000a between an output of the VCO 110 and the phase detector 130.

The embodiment of FIG. 4 utilizes the delay circuit 150a as the reset circuit 150 of FIG. 2, and separately, adds the frequency multiplier 160 in the PLL feedback path to the configuration described previously in connection with FIG. 2. Otherwise, like reference numbers in FIGS. 2 and 4 refer to like elements, and a detailed explanation of such elements is omitted here to avoid redundancy in the description.

The frequency multiplier 170 increases a resolution associated with the frequency divider 120 by multiplying the frequency FOUT of the VCO output signal by a multiplier M which may be fixed or programmable. As such, the frequency of the signal applied to the frequency divider 120 is $F_{OUT}$ times M. In this case, the frequency divided signal output from the frequency divider 120 is $F_{OUT}$ times M/N (i.e., FOUT*M/N), and the output frequency of the VCO is $F_{CLK}$ times N/(M*R). As one arbitrary and non-limiting example, M=60. In this case, the frequency divided signal output from the frequency divider 120 is $F_{OUT}$ times M/N (i.e., FOUT*60/N)

In the meantime, the delay circuit 150a of FIG. 4 may be programmable and is operative, for example, to delay the reference signal by a time period corresponding to lock angle at the reference frequency $F_{REF}$ of the reference signal. Assuming a reference frequency of 500 kHz, each period of the reference signal is 2,000 ns. Further assuming a lock angle of 90 degrees, the time period corresponding to the lock angle at the reference frequency is 500 ns. As such, in this example, the delay circuit 150a delays the reference signal by 500 ns, and the thus delayed reference signal results in a resetting of the frequency divider 120. Should the reference frequency be changed, the delay time would need to be adjusted (reprogrammed) to maintain the 90-degree initial phase. In this manner, a phase difference of 90 degrees is established between the reference signal and the output of the frequency divider 120.

Figure 5:
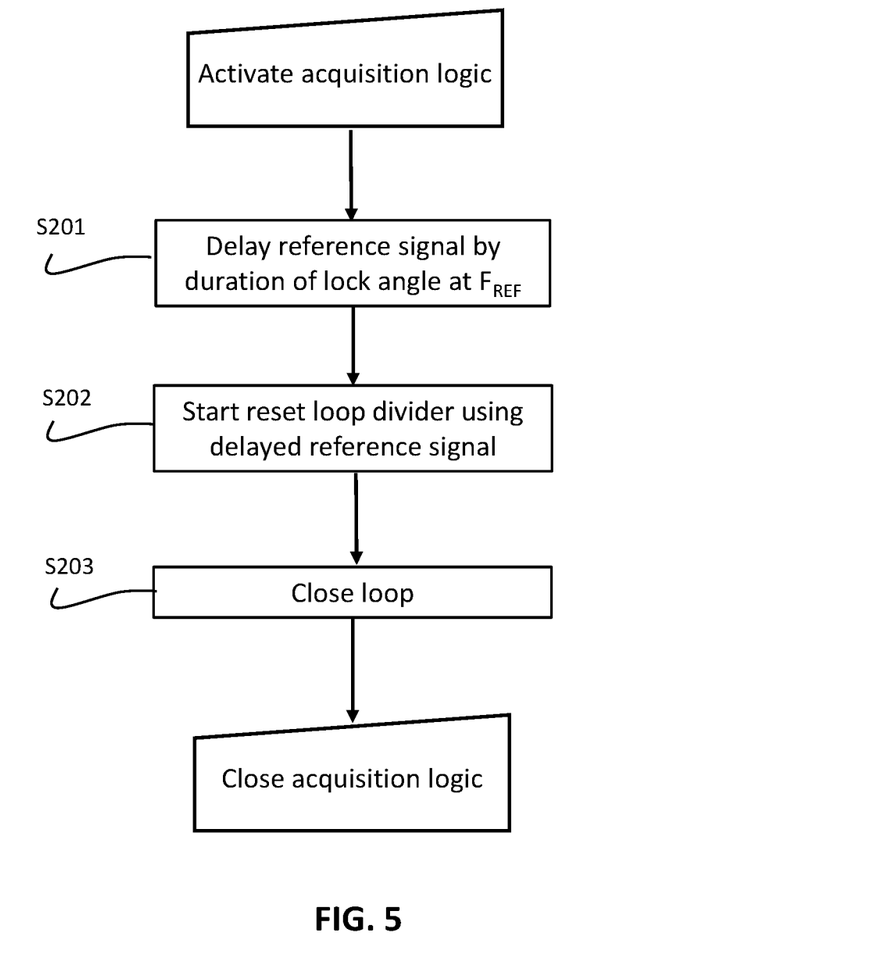
FIG. 5 is a flow diagram for reference in describing a method of operating a PLL according to another embodiment of the inventive concepts.

FIG. 5 is a flow diagram for reference in describing acquisition logic for initializing a PLL according to an embodiment of the inventive concepts.

Referring to FIGS. 4 and 5, prior to closing the PLL loop (i.e., prior to operating the PLL feedback path to synthesize an output frequency of the VCO 110), the delay circuit 150a delays the reference signal by a time duration corresponding to the lock angle at the reference frequency $F_{REF}$ (S201).

Then, the frequency divider 120 is started in a reset state in response to the delayed reference signal, e.g., in response to a positive edge (or negative edge) of the delayed reference signal. As a result, the relative phase angle of the output of the frequency divider 120 in the PLL feedback path is preset such that it differs from the phase angle of the reference signal by an amount corresponding in duration to the lock angle of the PLL (S202) at the reference frequency $F_{REF}$. This may be achieved, in the example of the current embodiment, by resetting the frequency divider 120 in the PLL feedback path at a given time after a positive edge (or negative edge) of the reference signal. The PLL loop is then closed upon starting of the frequency divider 120 (S203).

Figure 6:
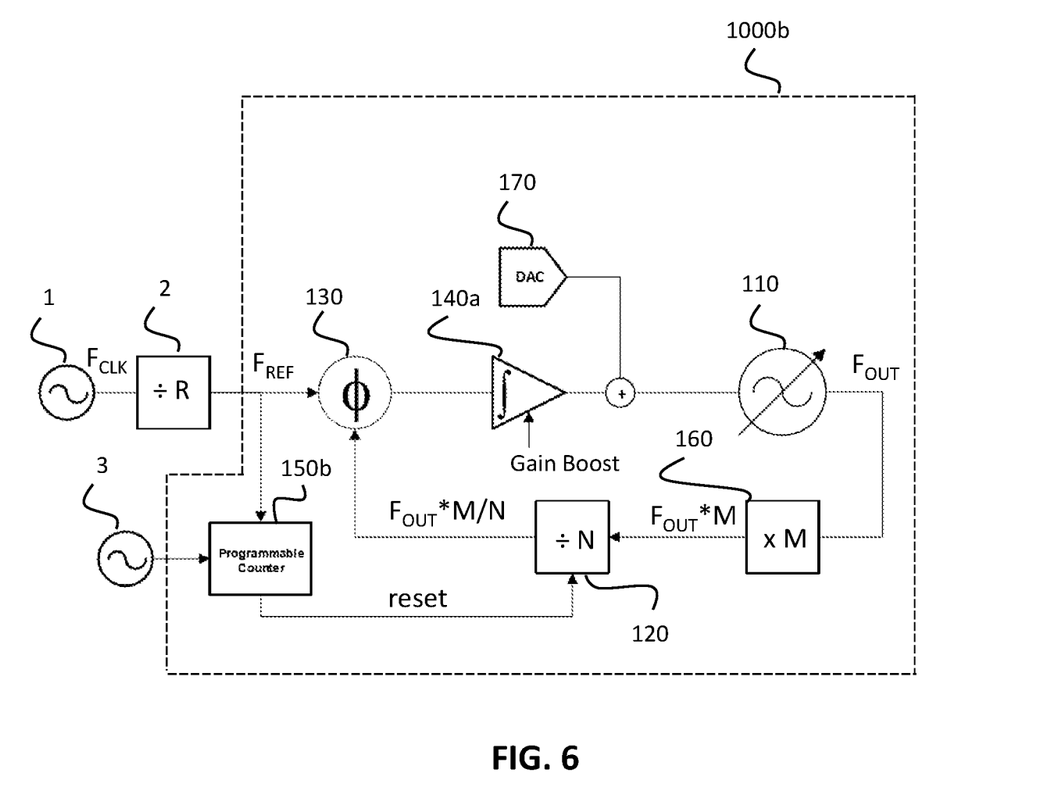
FIG. 6 is a circuit diagram of a phase lock loop (PLL) of an embodiment of the inventive concepts.

FIG. 6 is a circuit diagram of a PLL 1000b according to another embodiment of the inventive concepts.

Referring to FIG. 6, the PLL of the example of this embodiment includes a VCO 110, a frequency multiplier 160, a frequency divider 120a, a phase detector 130, a loop filter 140a, a digital-to-analog convertor (DAC) 170 and a delay circuit 150a. The frequency multiplier 160 and the frequency divider 120 are in a feedback path of the PLL 1000b between an output of the VCO 110 and the phase detector 130.

The embodiment of FIG. 6 utilizes the programmable counter 150b as the reset circuit 150 of FIG. 3, and separately, adds gain boost functionality to the loop filter 140a, and the DAC 170 to the output of the loop filter 140a. Otherwise, like reference numbers in FIGS. 2, 4 and 6 refer to like elements, and a detailed explanation of such elements is omitted here to avoid redundancy in the description.

The PLL of FIG. 6 may lock a wide range of external reference frequencies of 1-110 MHz. The programmable counter 150b operates as described above in connection with the flow diagram of FIG. 5. The DAC 170 can tune the VCO over its full range and the PLL may be designed to tune over a much smaller range. The loop multiplier 160 in front of the frequency divider 120 allows for a larger N value. A larger N value has multiple benefits, such as finer frequency steps when N is an integer ("interger-N"), and, in the case where N is a fraction ("fractional-N") it allows for finer frequency jumps (dither) to result in a required average frequency. When the loop is locked, the OCXO frequency is equal to the reference $F_{ax}$ times the ratio of N/(M*R).

Figure 7:
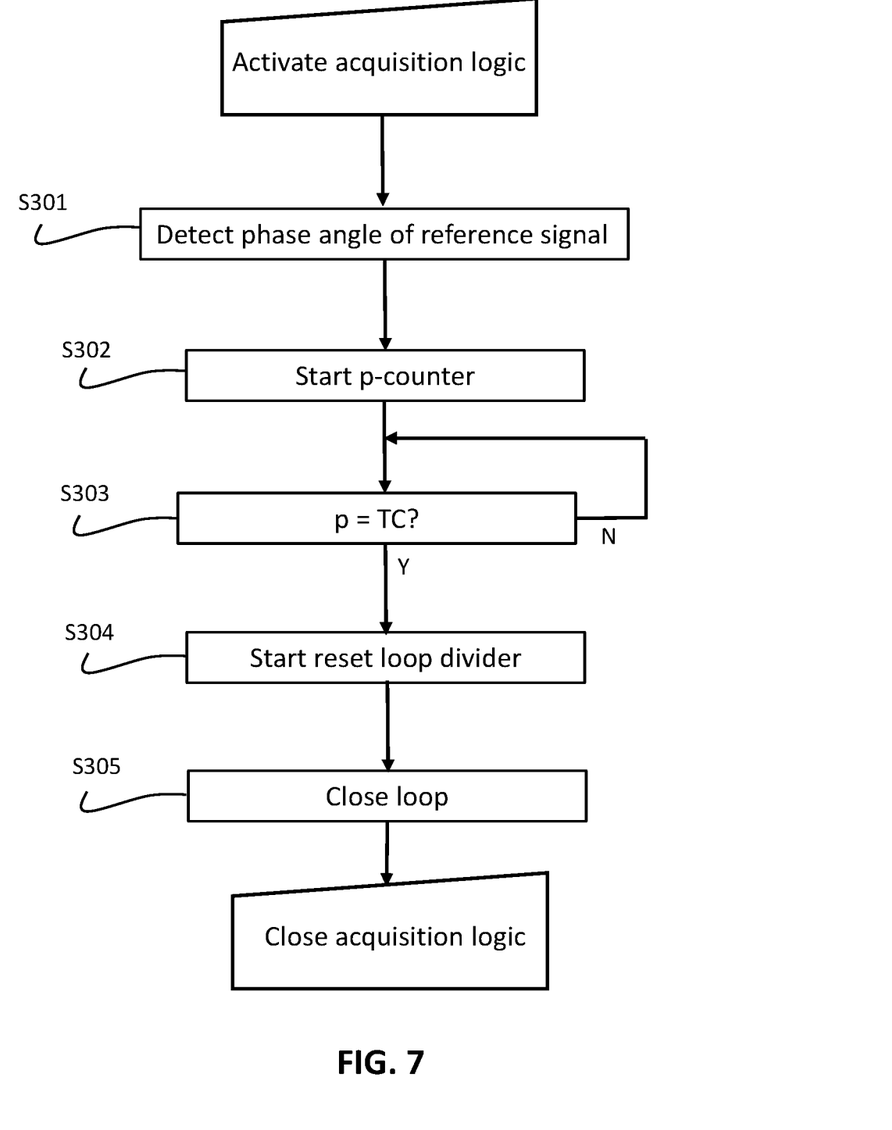
FIG. 7 is a flow diagram for reference in describing a method of operating a PLL according to an embodiment of the inventive concepts.

FIG. 7 is a flow diagram for reference in describing acquisition logic for initializing a PLL according to an embodiment of the inventive concepts.

Referring to FIGS. 6 and 7, in an initialization mode of the PLL, a given phase angle of the reference signal is detected (301). The phase angle may be, for example, a positive edge of the reference signal.

Upon detecting the given phase angle of the reference signal, the counter 150b is activated (S302). For purposes of explanation, the count value of the counter 150b is referred to as "p". The counter 150b may be preprogrammed with a terminal count TC such that a duration from p=0 to p=TC corresponds to a duration of a lock angle of the PLL at the reference frequency $F_{REF}$ of the reference signal.

As an example, again assume a reference signal of 500 kHz and a lock angle of the PLL is 90 degrees. The 500 kHz reference signal has a period of 2,000 ns, and accordingly, 90 degrees corresponds to 500 ns. Further assume that the counter is clocked at 100 MHz. At that count rate, a count of 50 would correspond to 500 ns. As such, the terminal count (TC) is set (or programmed) at 50. On the positive edge (or negative edge) of the reference signal, for example, the counter may be started.

Upon reaching the TC of 50 ("yes" at S303), the counter would start the loop divider in a reset state (S304) and close the PLL loop (S305). For example, in the case where the loop divider 120 is implemented with a counter, the counter is reset to zero. Should the reference frequency $F_{REF}$ be changed, the value of TC may be adjusted (reprogrammed) to maintain the 90-degree initial phase. In this manner, a phase difference of 90 degrees is established between the reference signal and the output of the frequency divider 120.

Figure 8:
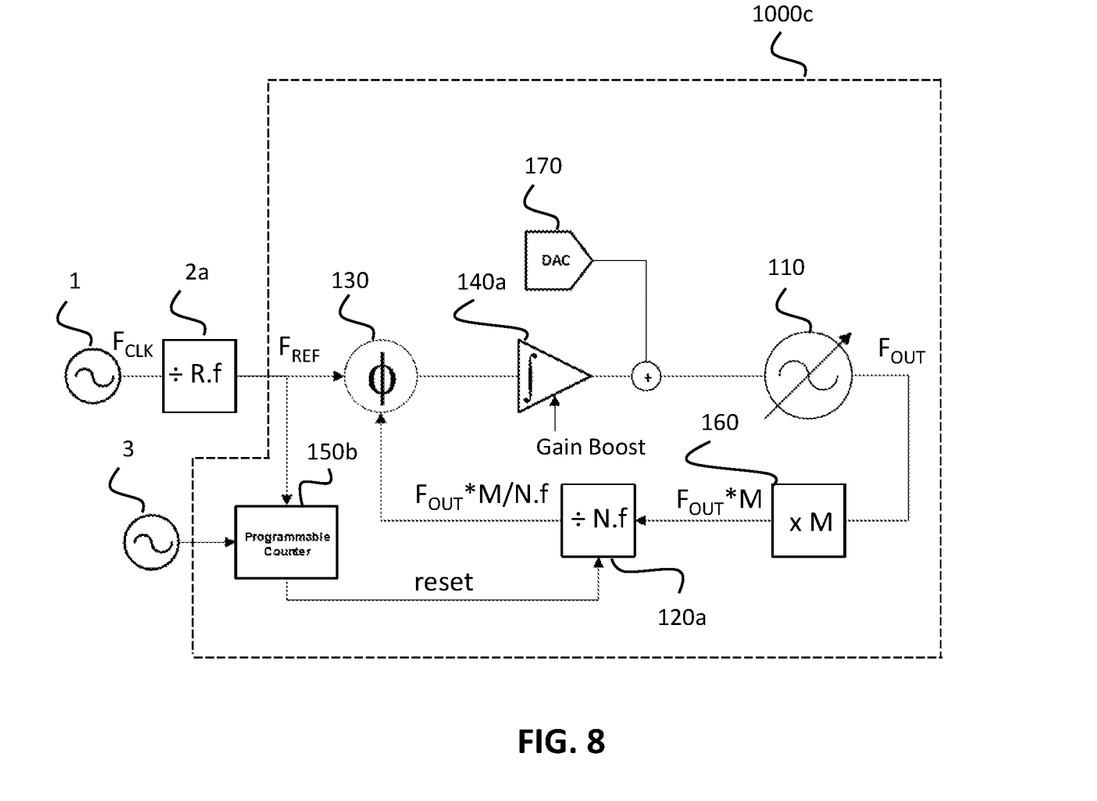
FIG. 8 is a circuit diagram of a phase lock loop (PLL) of another embodiment of the inventive concepts.

FIG. 8 is a circuit diagram of a PLL 1000c according to another embodiment of the inventive concepts.

Referring to FIG. 8, the PLL of the example of this embodiment includes a VCO 110, a frequency multiplier 160, a frequency divider 120a, a phase detector 130, a loop filter 140a, a digital-to-analog convertor (DAC) 170 and a delay circuit 150a. The frequency multiplier 170 and the frequency divider 120 are in a feedback path of the PLL 1000c between an output of the VCO 110 and the phase detector 130.

The embodiment of FIG. 8 utilizes fractional-N frequency dividers for the frequency dividers 2a and 120a of the reference signal and PLL loop, respectively. Otherwise, like reference numbers in FIGS. 2, 4, 6 and 8 refer to like elements, and a detailed explanation of such elements is omitted here to avoid redundancy in the description.

While the term "fractional divider" is used, in actuality the dividers 2a and 120a are integer dividers with added logic (an engine) that produces varying integer divide ratios to which the dividers are continuously re-programmed such that the average divide ratio is some non-integer (i.e. NI). That is, the dividers are still integer, but are re-programmed at a high rate. The fractional part resides in the engine that produces the varying integer-N values.

The PLL of FIG. 8 may lock a high-Q 10 MHz OCXO to a wide range of external reference frequencies of 1-110 MHz. The programmable counter 150b operates as described above in connection with the flow diagram of FIG. 5. The DAC 170 can tune the VCO over its full range and the PLL may be designed to tune over a much smaller range. The frequency divider 120a is fractional-N (N.f) to provide the required fine frequency step size. The loop multiplier 160 in front of the fractional-N divider 120a, combined with maximizing the divided reference frequency, allows the loop gain to be minimized for low noise. When the loop is locked, the OCXO frequency is equal to the reference $F_{CLK}$ times the ratio of N.f/(M*R.f).

The previous embodiments are particularly suitable for integer division, where each output cycle of the dividers is made up of the same number of input cycles (N, R). On the other hand, in fractional division of the current embodiment, the divide ratio (N, R) is changed on a regular basis, so that the effective average division ratio ends up being N.f or R.f. As such, any given divider output cycle can be off from the average phase by some amount, technically up to the maximum range the phase-detector can handle without wrapping. This is primarily an issue with the R.f divider 2a, rather than the N.f divider 120a, since the N.f divider has a high enough ratio so that the instantaneous changes in the N ratio are relatively small. The R.f divider 2a can be as low as 2, so the instantaneous phase could be 50% off.

The R.f divider 2a is implemented to swallow one cycle every X cycles (where X is a positive integer greater than 1). For example, in the case where X=9, the instantaneous divide ratio may be 4, 4, 4, 4, 4, 4, 4, 4, 5, 4, 4, 4, 4, 4, 4, 4, 5 . . . . This translates into is a phase-detector output that has the shape of a saw-tooth. In the given example, the divider 2a is dividing by 4 eight times, which results in a phase that is ahead of what the average phase should be. Then every $9^{th}$ time (in this example) there is a divide by 5, making that cycle a bit longer, which makes the instantaneous phase lag the average. This saw-tooth is centered about the average phase.

The circuits as described in the previous embodiments utilize the R-divider output to reset the N-divider. However, in the embodiment of FIG. 8, if one were to take any arbitrary cycle of the R.f divider 2a, the result would end up randomly with one of the instantaneous phases, which could be quite far from the average phase. As described next, this concern is overcome by waiting until the fractional-R divider 2a is at the center point of that saw-tooth to reset the N.f divider 120a of the PLL loop. The center point of the saw-tooth is at or near the average phase. For example, in the pattern described previously, the $4^{th}$ or $5^{th}$ cycle of divide-by-4 is the center of the saw-tooth, so that is where the activation of the N.f divider 120a reset should occur.

In an alternative embodiment, rather than waiting for the correct phase of the divider 2a, the fractional-R engine may reset the divider 2a to the mid-point (e.g., in the example given above, it would be reset as 4, 4, 4, 4, 5, 4, 4, 4, 4, 4, 4, 4, 4, 5, . . . ). In this way, upon reset, the fractional-R engine would start at the mid-point of the saw-tooth.

Figure 9:
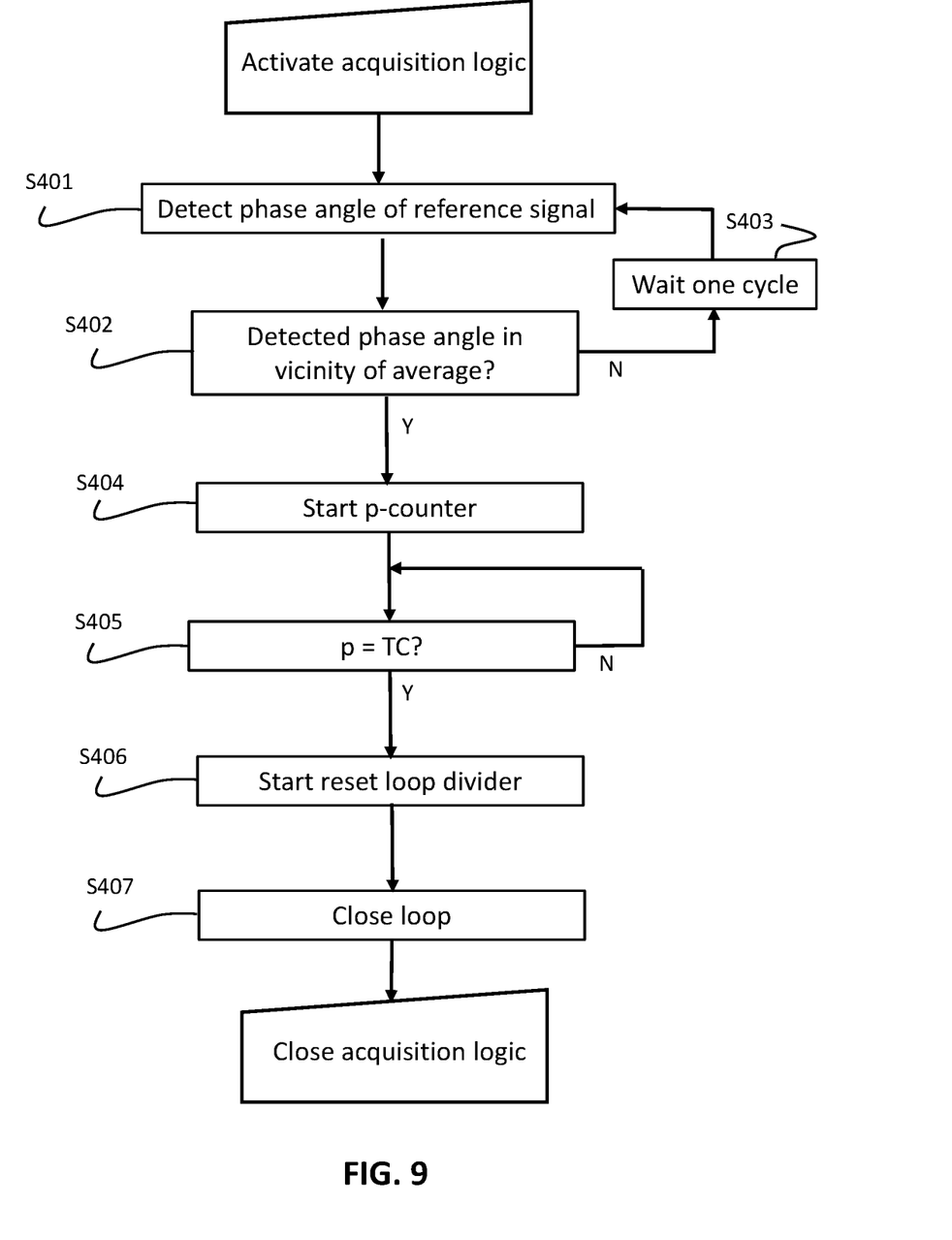
FIG. 9 is a flow diagram for reference in describing a method of operating a PLL according to another embodiment of the inventive concepts.

FIG. 9 is a flow diagram for reference in describing acquisition logic for initializing a PLL of FIG. 8 according to an embodiment of the inventive concepts.

Referring to FIGS. 8 and 9, in an initialization mode of the PLL, a given phase angle of the reference signal is detected (401). The phase angle may be, for example, a positive edge (or negative edge) of the reference signal.

Upon detecting the given phase angle of the reference signal, a determination is made as to whether the given phase angle is at or near an average phase of the reference signal (S402). If not, then the acquisition logic waits one cycle (S403) for the next given phase angle (e.g., the next positive or negative edge) of the reference signal. This is repeated until the detected phase angle is at or near the average phase of the reference signal ("yes" at S402). At this time, the counter 150b is activated (S404). The reminder of the acquisition logic is the same as that described previously in connection with FIG. 7. Namely, as with the previous embodiment, the counter 150b may be preprogrammed with a terminal count TC such that a duration from p=0 to p=TC corresponds to a duration of a lock angle of the PLL at the reference frequency $F_{REF}$ of the reference signal. Upon reaching the TC of 50 ("yes" at S405), the counter 150B would start the loop divider 120 in a reset state (S406) and the PLL loop would be closed (S407). For example, in the case where the loop divider 120 is implemented with a counter, the counter is reset to zero. Should the reference frequency $F_{REF}$ be changed, the value of TC may be adjusted (reprogrammed) to maintain the 90-degree initial phase. In this manner, a phase difference of 90 degrees, for example, is established between the reference signal and the output of the frequency divider 120.

The inventive concepts can be applied to overcome the limited frequency tunability (by the PLL) at the phase detector that otherwise results in a long wait time, even if the PLL loop were very wide (i.e. fast). 1 Hz offset requires 1 second for a full 360 degrees, 0.1 Hz requires 10 seconds, 0.01 Hz requires 100 seconds, and so on. Having a slow loop adds some seconds at the beginning and end of the acquisition period, but a fast loop can not eliminate that large chunk of time.

If the phase detector is a digital phase frequency detector, the initial lock angle may not be 90 degrees but rather some offset from 0 degree to avoid the dead zone. The amount of delay would need to be adjusted to this offset. If the reference frequency is fixed, there is no need for the programmable counter. A simple stable RC time delay or a simple counter producing the fixed delay can be used to reset the loop divider.

It is noted that a frequency divider with a ratio of N has N possible output phases. Normal startup of the divider results in a random phase (one of N possibilities). The inventive concepts select the one of N phase states that results in the closest alignment of reference and VCO signal at the phase detector, such that locking the loop requires the least intervention by the PLL.

As described above, the inventive concepts present PLL methods and devices in which the phase angle of the PLL feedback signal is preset relative to the reference signal in order to accelerate the locking time. The inventive concepts, while not so limited, may be especially advantageous in the case of PLLs with relatively narrow-loop bandwidths and relatively limited maximum achievable tuning ranges. Separately, it is noted that implementations of the inventive concepts may be as simple as adding code to the configurable logic blocks (CLBs) of Field Programmable Gate Array (FPGA) semiconductor devices, whereas other implementations may be discrete or in an application specific integrated circuit (ASIC).

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. While representative embodiments are disclosed herein, one of ordinary skill in the art appreciates that many variations that are in accordance with the present teachings are possible and remain within the scope of the appended claim set. The invention therefore is not to be restricted except within the scope of the appended claims,

What is claimed is:

1. A phase lock loop (PLL) comprising:
a phase detector configured to output a signal indicative of a phase difference between a reference signal and a feedback signal;
a loop filter configured to filter an output of the phase detector;
a voltage-controlled oscillator (VCO) configured to output an oscillating signal having a frequency corresponding to an output of the loop filter;
a frequency divider configured to output the feedback signal by frequency dividing the oscillating signal output by the VCO; and
a reset circuit configured to reset the frequency divider in an initialization mode such that a phase difference between the reference signal and the feedback signal corresponds to a lock angle of the PLL.

2. The PLL of claim 1, wherein the reset circuit is a delay circuit configured to delay the reference signal by the lock angle of the PLL and to apply the delayed reference signal as a reset signal to the frequency divider.

3. The PLL of claim 2, wherein the delay circuit is programmable.

4. The PLL of claim 1, wherein the reset circuit is a counter activated in response to the reference signal.

5. The PLL of claim 4, wherein a terminal count of the counter is programmable to correspond in duration to the lock angle of the PLL.

6. The PLL of claim 5, wherein the counter is configured to reset the frequency divider when a count value reaches the terminal count.

7. The PLL of claim 4, wherein the reference signal is a fractional-R divided clock signal, and wherein the reset circuit is activated in response to a cycle of the reference signal having a phase in a vicinity of an average phase of the reference signal.

8. The PLL of claim 1, further comprising a frequency multiplier configured to multiply a frequency of the oscillating signal output by the VCO and to apply a resultant multiplied frequency signal as an input to the frequency divider.

9. The PLL of claim 1, wherein the frequency divider is a fractional-N frequency divider.

10. A method of initializing a phase lock loop (PLL), the PLL including a frequency divider in a feedback loop between an output of a voltage-controlled oscillator (VCO) and an input to a phase detector, the phase detector comparing a phase between a reference signal and an output of the frequency divider to drive the VCO, the method comprising:
programming a terminal count of a programmable counter such that a count duration to the terminal count corresponds to a duration of a lock angle of the PLL at a reference frequency of the reference signal;
activating the counter upon detecting a given phase angle of the reference signal; and
presetting the frequency divider when a count value of the counter reaches the terminal count.

11. The method of claim 10, wherein the given phase angle of the reference signal is a positive edge or negative edge of the reference signal.

12. The method of claim 10, further comprising closing the feedback loop upon presetting the phase angle of the frequency divider.

13. The method of claim 10, wherein the frequency divider is a fractional-N frequency divider.

14. The method of claim 13, wherein the reference signal is a fractional-R divided clock signal, and wherein the frequency divider of the PLL is preset in response to a cycle of the reference signal having a phase in a vicinity of an average phase of the reference signal.

15. A method of initializing a phase lock loop (PLL), the PLL including a frequency divider in a feedback loop between an output of a voltage-controlled oscillator (VCO) and an input to a phase detector, the phase detector comparing a phase between a reference signal and an output of frequency divider to drive the VCO, wherein the reference signal is a fractional-R divided clock signal, the method comprising:
activating a counter upon detecting a positive edge or negative edge of the reference signal in a cycle of the reference signal having a phase in a vicinity of an average phase of the reference signal;
presetting, in response to the counter reaching a terminal count, the frequency divider of the PLL such that a difference between the phase angle of the reference signal and a phase angle of the frequency divider output corresponds to a lock angle of the PLL.

16. The method of claim 15, further comprising closing the feedback loop upon presetting the phase angle of the frequency divider.

* * * * *